US012666577B2

(12) United States Patent
Zhang et al.

(10) Patent No.: US 12,666,577 B2
(45) Date of Patent: Jun. 23, 2026

(54) METHOD FOR CONTROLLING HEAT DISSIPATION FAN AND RELATED APPARATUS

(71) Applicant: Fulian Precision Electronics (Tianjin) Co., LTD., Tianjin (CN)

(72) Inventors: Shu-Wei Zhang, Tianjin (CN); Nan Zhang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 386 days.

(21) Appl. No.: 18/228,716

(22) Filed: Aug. 1, 2023

(65) Prior Publication Data

US 2025/0016965 A1 Jan. 9, 2025

(30) Foreign Application Priority Data

Jul. 5, 2023 (CN) .......................... 202310823639.9

(51) Int. Cl.
H05K 7/20 (2006.01)
F04D 27/00 (2006.01)

(52) U.S. Cl.
CPC ....... H05K 7/20836 (2013.01); F04D 27/004 (2013.01); H05K 7/20718 (2013.01)

(58) Field of Classification Search
CPC ........... H05K 7/20836; H05K 7/20718; H05K 7/20209; F04D 27/004; G06F 1/206
See application file for complete search history.

(56) References Cited

U.S. PATENT DOCUMENTS

| | | | | |
|---|---|---|---|---|
| 2014/0142764 A1* | 5/2014 | Chen | ................... | G06F 11/2028 |
| | | | | 700/276 |
| 2023/0070920 A1* | 3/2023 | Huang | ...................... | G06F 1/20 |

FOREIGN PATENT DOCUMENTS

| | | | | | |
|---|---|---|---|---|---|
| CN | 110469529 A | | 11/2019 | | |
| CN | 112948185 A | * | 6/2021 | .......... | G06F 11/2033 |
| CN | 114996096 A | * | 9/2022 | .......... | G06F 11/3006 |
| TW | 201422923 A | | 6/2014 | | |

* cited by examiner

*Primary Examiner* — Michael W Choi
(74) *Attorney, Agent, or Firm* — ScienBiziP, P.C.

(57) ABSTRACT

A method and a module for controlling a heat dissipation fan, and a non-transitory computer readable medium are provided, the module includes a BMC and a CPLD, the method includes: controlling the heat dissipation fan by the CPLD when the BMC stopped controlling the heat dissipation fan; obtaining a predetermined rotational speed and a predetermined control curve by the CPLD according to a status of the BMC and/or a status of the server; and detecting an environment temperature, obtaining a target rotational speed according to the environment temperature and the predetermined control curve, and controlling the heat dissipation fan to work with the target rotational speed by the CPLD, wherein the target rotational speed is less or equal to the predetermined rotational speed.

20 Claims, 5 Drawing Sheets

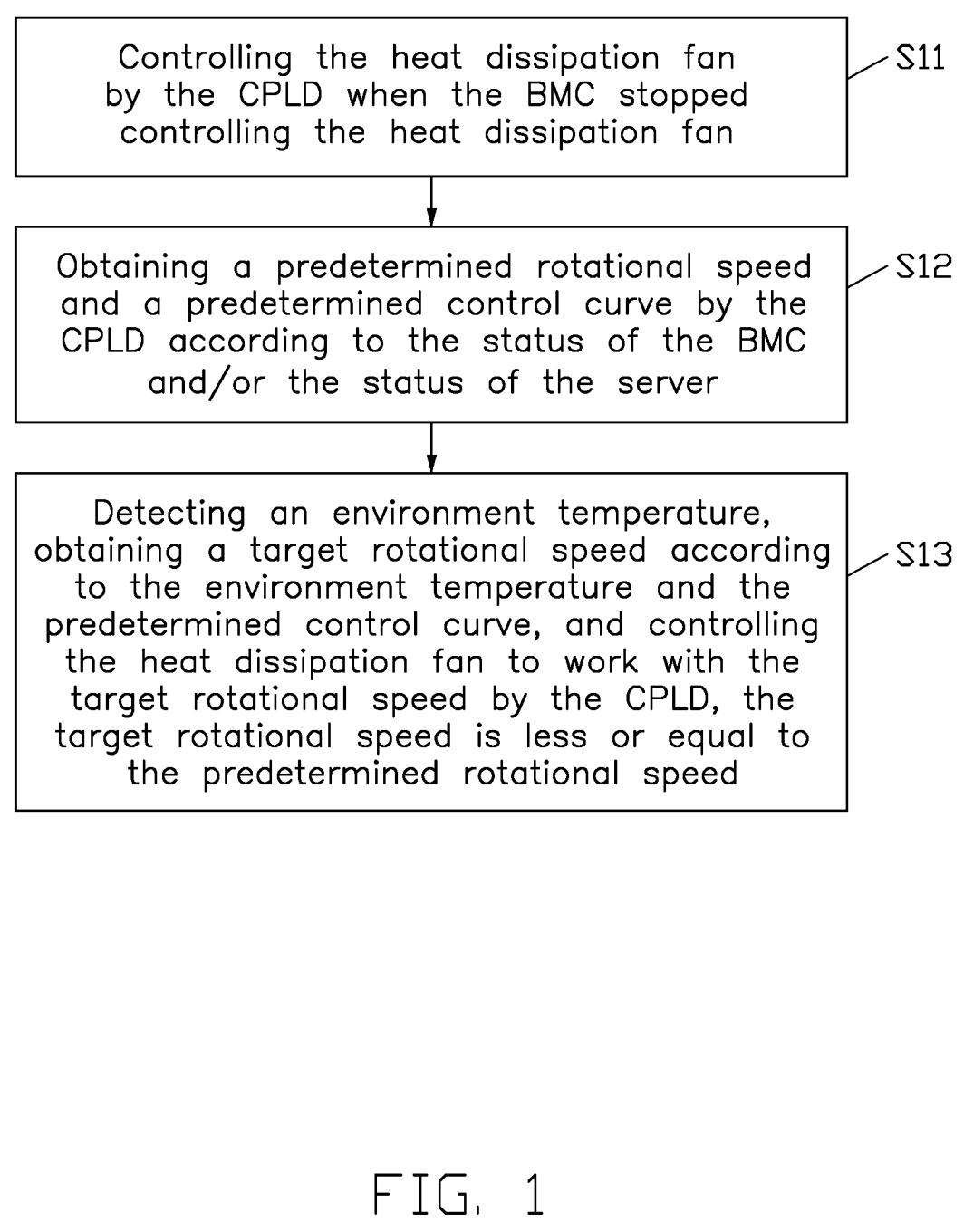

Controlling the heat dissipation fan by the CPLD when the BMC stopped controlling the heat dissipation fan /S11

Obtaining a predetermined rotational speed and a predetermined control curve by the CPLD according to the status of the BMC and/or the status of the server /S12

Detecting an environment temperature, obtaining a target rotational speed according to the environment temperature and the predetermined control curve, and controlling the heat dissipation fan to work with the target rotational speed by the CPLD, the target rotational speed is less or equal to the predetermined rotational speed /S13

FIG. 1

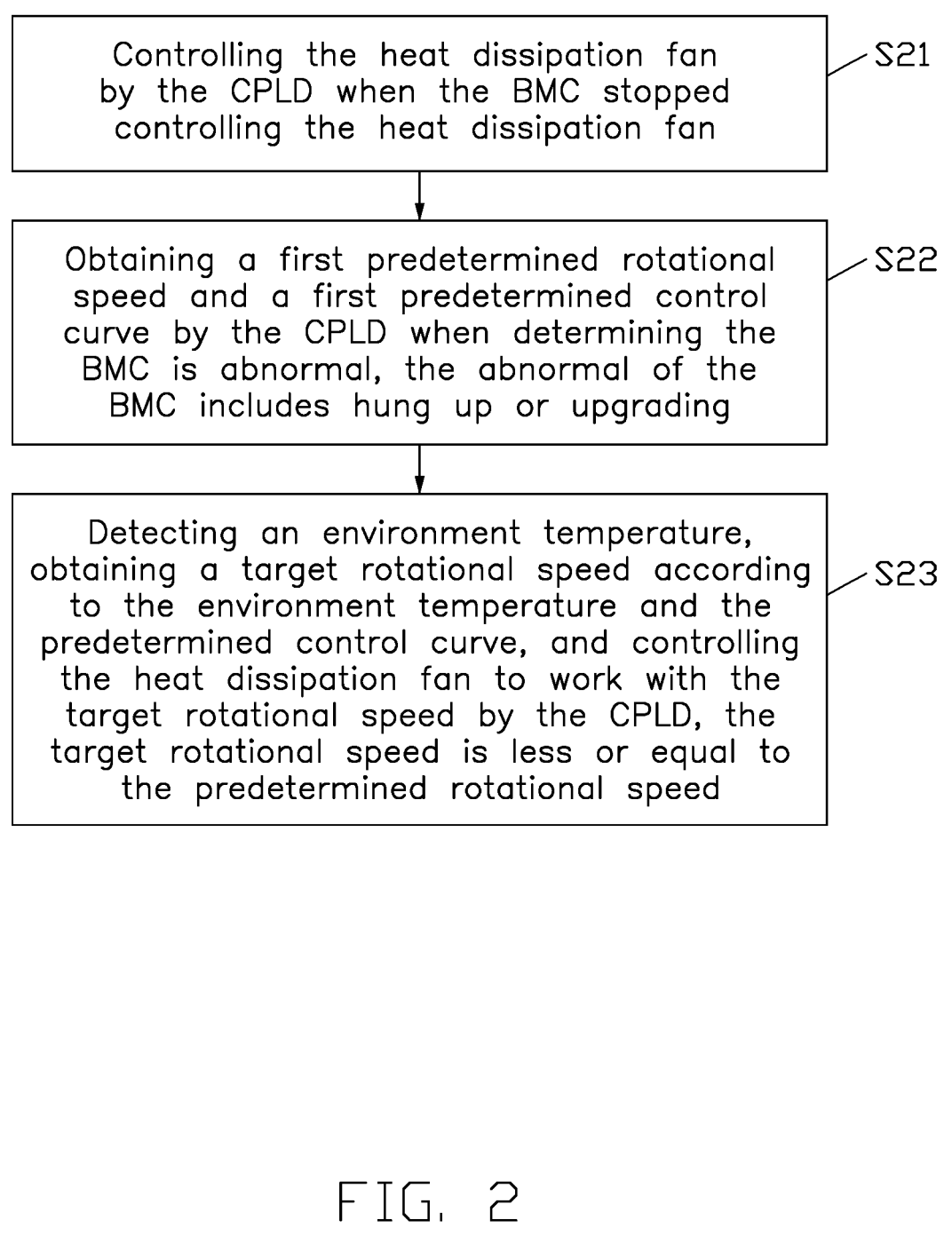

Controlling the heat dissipation fan by the CPLD when the BMC stopped controlling the heat dissipation fan — S21

Obtaining a first predetermined rotational speed and a first predetermined control curve by the CPLD when determining the BMC is abnormal, the abnormal of the BMC includes hung up or upgrading — S22

Detecting an environment temperature, obtaining a target rotational speed according to the environment temperature and the predetermined control curve, and controlling the heat dissipation fan to work with the target rotational speed by the CPLD, the target rotational speed is less or equal to the predetermined rotational speed — S23

FIG. 2

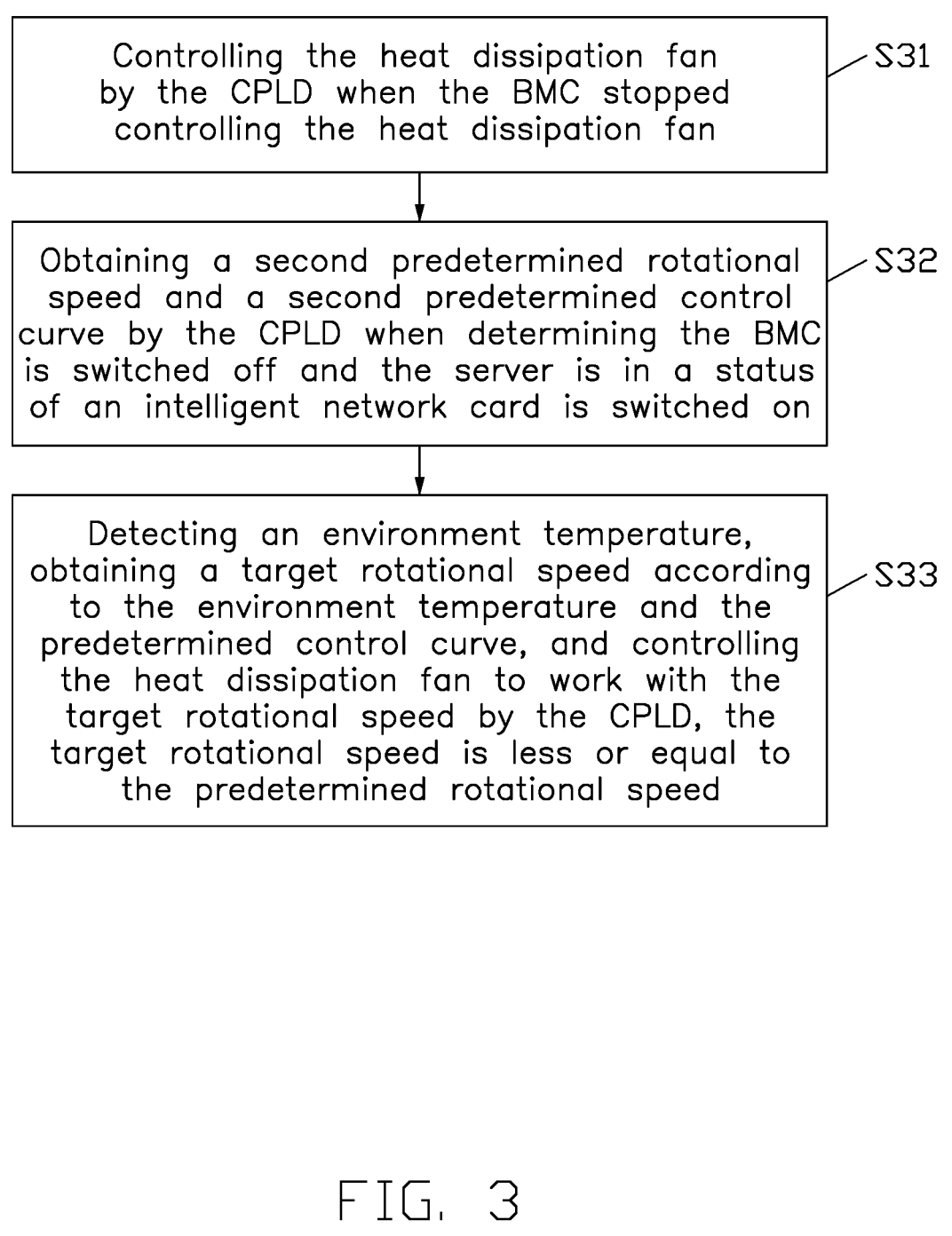

Controlling the heat dissipation fan by the CPLD when the BMC stopped controlling the heat dissipation fan —S31

Obtaining a second predetermined rotational speed and a second predetermined control curve by the CPLD when determining the BMC is switched off and the server is in a status of an intelligent network card is switched on —S32

Detecting an environment temperature, obtaining a target rotational speed according to the environment temperature and the predetermined control curve, and controlling the heat dissipation fan to work with the target rotational speed by the CPLD, the target rotational speed is less or equal to the predetermined rotational speed —S33

FIG. 3

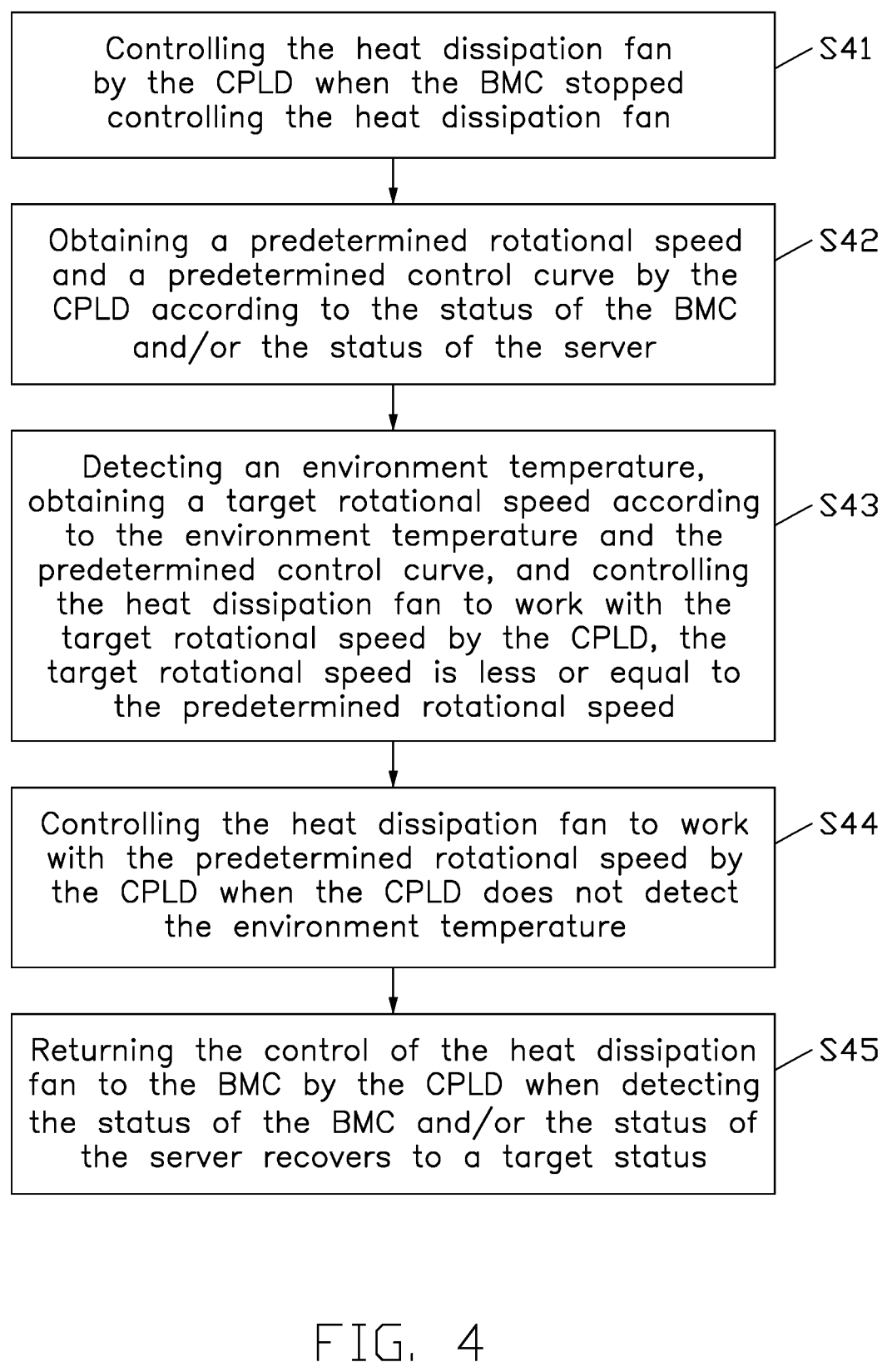

Controlling the heat dissipation fan by the CPLD when the BMC stopped controlling the heat dissipation fan — S41

Obtaining a predetermined rotational speed and a predetermined control curve by the CPLD according to the status of the BMC and/or the status of the server — S42

Detecting an environment temperature, obtaining a target rotational speed according to the environment temperature and the predetermined control curve, and controlling the heat dissipation fan to work with the target rotational speed by the CPLD, the target rotational speed is less or equal to the predetermined rotational speed — S43

Controlling the heat dissipation fan to work with the predetermined rotational speed by the CPLD when the CPLD does not detect the environment temperature — S44

Returning the control of the heat dissipation fan to the BMC by the CPLD when detecting the status of the BMC and/or the status of the server recovers to a target status — S45

FIG. 4

METHOD FOR CONTROLLING HEAT DISSIPATION FAN AND RELATED APPARATUS

CROSS-REFERENCE TO RELATED APPLICATIONS

This application claims priority to Chinese Patent Application No. 202310823639.9 filed on Jul. 5, 2023, in China National Intellectual Property Administration, the contents of which are incorporated by reference herein.

FIELD

The subject matter herein generally relates to computer heat dissipation technologies, and specially relates to a method for controlling heat dissipation fan and related apparatus, the related apparatus includes a module for controlling heat dissipation fan and a non-transitory computer-readable storage medium.

BACKGROUND

At present, with the rapid development of the Internet and the Internet of Things (IOT), the server industry is also developing continuously, and the demand for servers is also increasing. During a running of the present server, components of the server will generate a lot of heat, so a fan is installed in the server to dissipate heat from the heat-generating components. The fan of the server is jointly controlled by a baseboard management controller (BMC) and a complex programmable logic device (CPLD). During normal running of the server, the BMC controls the fan, but when the BMC is upgrading or hangs up, the CPLD will take over the control. When the CPLD takes over to control the fan, it will control the fan to run at a higher fixed speed, thereby increasing the operating power consumption of the server and generating greater fan noise.

BRIEF DESCRIPTION OF THE DRAWINGS

Implementations of the present disclosure will now be described, by way of example only, with reference to the attached figures.

FIG. 1 is a flow chart of an embodiment of a method for controlling heat dissipation fan according to the present application.

FIG. 2 is a flow chart of an embodiment of a method for controlling heat dissipation fan according to the present application.

FIG. 3 is a flow chart of an embodiment of a method for controlling heat dissipation fan according to the present application.

FIG. 4 is a flow chart of an embodiment of a method for controlling heat dissipation fan according to the present application.

DETAILED DESCRIPTION

Figure 5:
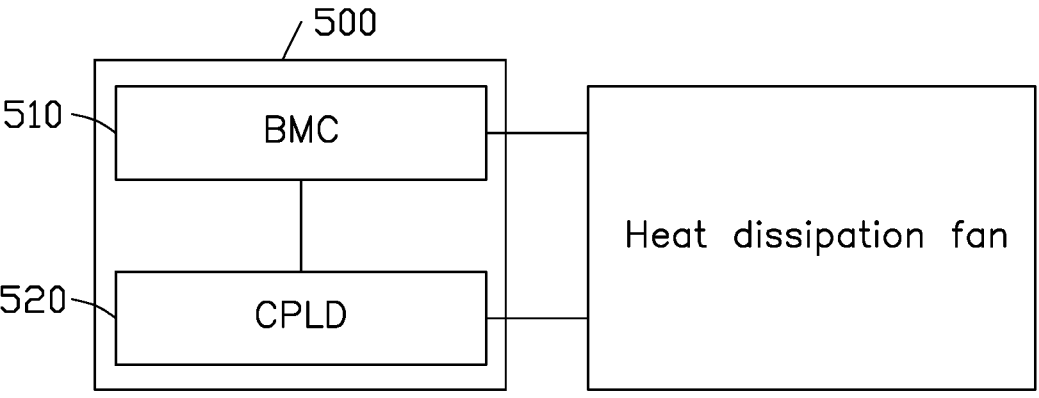
FIG. 5 is a schematic diagram of an embodiment of a module for controlling heat dissipation fan according to the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better show details and features of the present disclosure.

Several definitions that apply throughout this disclosure will now be presented.

The term "coupled" is defined as connected, whether directly or indirectly through intervening components, and is not necessarily limited to physical connections. The connection may be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but may have one or more deviations from a true cylinder. The term "comprising," when utilized, means "including, but not necessarily limited to"; it specifically indicates open-ended inclusion or membership in the so-described combination, group, series, and the like.

At present, with the rapid development of the Internet and the Internet of Things (IOT), the server industry is also developing continuously, and the demand for servers is also increasing. During a running of the present server, components of the server will generate a lot of heat, so a fan is installed in the server to dissipate heat from the heat-generating components. The fan of the server is jointly controlled by a baseboard management controller (BMC) and a complex programmable logic device (CPLD). During normal running of the server, the BMC controls the fan, but when the BMC is upgrading or hangs up, the CPLD will take over the control. When the CPLD takes over to control the fan, it will control the fan to run at a higher fixed speed, thereby increasing the operating power consumption of the server and generating greater fan noise.

A method for controlling heat dissipation fan for decreasing a running power consumption and a noise of the heat dissipation fan when the BMC is upgrading or hung up and controlled by the CPLD.

FIG. 1 illustrates a flow chart of an embodiment of a method for controlling heat dissipation fan according to the present application. The method can be applied in a server including a module for controlling heat dissipation fan. The module for controlling heat dissipation fan includes the BMC and the CPLD. The method may include:

At block S11, controlling the heat dissipation fan by the CPLD when the BMC stopped controlling the heat dissipation fan.

In at least one embodiment, during the server is running, the BMC may need to upgrade firmware, or processes of the BMC hangs up. When the BMC is upgrading or the process hung up, the BMC no longer controls the heat dissipation fan, the corresponding CPLD may take over to control the heat dissipation fan.

When the CPLD controls the heat dissipation fan, firstly obtaining a present status of the heat dissipation fan, identifying a status of the BMC, and identifying a status of the server, to take over to control the heat dissipation fan according to the present status of the heat dissipation fan, the status of the BMC, and the status of the server.

At block S12, obtaining a predetermined rotational speed and a predetermined control curve by the CPLD according to the status of the BMC and/or the status of the server.

In at least one embodiment, after the CPLD took over to control the heat dissipation fan, the CPLD uses the status of the BMC and/or the running status of the server to match and obtain the predetermined rotational speed and the predetermined control curve. The predetermined rotational speed may be a maximum rotational speed of the heat dissipation fan, the predetermined control curve may be a curve of the rotational speed corresponding to an environment temperature. The predetermined rotational speed and the predetermined control curve can be related to the status of the BMC and the running status of the server. The predetermined rotational speed and the predetermined control curve can be stored in a storage medium of the CPLD.

At block S13, detecting an environment temperature, obtaining a target rotational speed according to the environment temperature and the predetermined control curve, and controlling the heat dissipation fan to work with the target rotational speed by the CPLD. The target rotational speed is less or equal to the predetermined rotational speed.

In at least one embodiment, the CPLD detects the environment temperature of the server, uses the environment temperature to match the predetermined control curve, to obtain the target rotational speed corresponding to the environment temperature. The environment temperature includes a temperature of the server or a temperature of a target component of the server. Temperature sensors can be arranged in preset positions of the server or on the target component, the CPLD can obtain the environment temperature by the temperature sensors.

In at least one embodiment, when the BMC stops controlling the heat dissipation fan, the CPLD takes over to control the heat dissipation fan, the CPLD can obtain the environment temperature to match the corresponding target rotational speed, so as to achieve an open-loop control of the heat dissipation fan, decrease the operating power consumption of the server and the fan noise.

FIG. 2 illustrates a flow chart of an embodiment of the method for controlling heat dissipation fan according to the present application. The method can be applied in the server including the module for controlling heat dissipation fan. The module for controlling heat dissipation fan includes the BMC and the CPLD. The method may include:

At block S21, controlling the heat dissipation fan by the CPLD when the BMC stopped controlling the heat dissipation fan.

Block S21 can be referred to block S11, not repeated here.

At block S22, obtaining a first predetermined rotational speed and a first predetermined control curve by the CPLD when determining the BMC is abnormal. The abnormal of the BMC includes hung up or upgrading.

In at least one embodiment, the first predetermined control curve can be obtained by matching a first environment temperature gradient and a corresponding first rotational speed gradient. The first rotational speed gradient can be obtained by operating pressure treatment to the target component in the first environment temperature gradient when the server is running normally. The pressure treatment includes controlling the target component to run with full load. That is, when the server is running normally and the BMC is controlling normally, the CPLD can obtain real time environment temperature and real time rotational speed of the heat dissipation fan, so as to match and obtain the first predetermined control curve.

At block S23, detecting an environment temperature, obtaining a target rotational speed according to the environment temperature and the predetermined control curve, and controlling the heat dissipation fan to work with the target rotational speed by the CPLD. The target rotational speed is less or equal to the predetermined rotational speed.

Block S23 can be referred to block S13, not repeated here.

FIG. 3 illustrates a flow chart of an embodiment of the method for controlling heat dissipation fan according to the present application. The method can be applied in the server including the module for controlling heat dissipation fan. The module for controlling heat dissipation fan includes the BMC and the CPLD. The method may include:

At block S31, controlling the heat dissipation fan by the CPLD when the BMC stopped controlling the heat dissipation fan.

Block S31 can be referred to block S11, not repeated here.

At block S32, obtaining a second predetermined rotational speed and a second predetermined control curve by the CPLD when determining the BMC is switched off and the server is in a status of an intelligent network card is switched on.

In at least one embodiment, the second predetermined control curve can be obtained by matching a second environment temperature gradient and a corresponding second rotational speed gradient. The second rotational speed gradient can be obtained by operating pressure treatment to the intelligent network card in the second environment temperature gradient when the server is running normally.

The intelligent network card is one of heat generating components of the server, when the BMC controls the heat dissipation fan corresponding to the intelligent network card, the CPLD can obtain an environment temperature of the intelligent network card and the rotational speed of the heat dissipation fan, so as to match and obtain the second predetermined control curve. When the BMC controls the heat dissipation fan, operating pressure treatment to the intelligent network card, that is the intelligent network card runs with full load, obtaining a maximum rotational speed of the heat dissipation fan as the second predetermined rotational speed.

At block S33, detecting an environment temperature, obtaining a target rotational speed according to the environment temperature and the predetermined control curve, and controlling the heat dissipation fan to work with the target rotational speed by the CPLD. The target rotational speed is less or equal to the predetermined rotational speed.

Block S33 can be referred to block S13, not repeated here.

FIG. 4 illustrates a flow chart of an embodiment of the method for controlling heat dissipation fan according to the present application. The method for controlling heat dissipation fan of FIG. 4 includes blocks S41-S43, which are corresponding to blocks S11-S13 of FIG. 1, not repeated here. Differences of the method for controlling heat dissipation fan of FIG. 4 comparing to the method for controlling heat dissipation fan of FIG. 1, method for controlling heat dissipation fan of FIG. 4 further includes:

At block S44, controlling the heat dissipation fan to work with the predetermined rotational speed by the CPLD when the CPLD does not detect the environment temperature.

In at least one embodiment, after the CPLD obtained the predetermined rotational speed and the predetermined control curve, and when the CPLD does not detect the environment temperature, the CPLD can control the heat dissipation fan to work with the predetermined rotational speed.

The predetermined rotational speed can be the maximum rotational speed of the heat dissipation fan for dissipating heat accumulation.

At block S45, returning the control of the heat dissipation fan to the BMC by the CPLD when detecting the status of the BMC and/or the status of the server recovers to a target status.

In at least one embodiment, the target status is a normal working status of the BMC and a normal activating and running status of the server.

FIG. 5 illustrates a schematic diagram of an embodiment of the module for controlling heat dissipation fan according to the present application.

The module 500 for controlling heat dissipation fan includes a BMC 510 and a CPLD 520. The BMC 510 is configured to control the rotational speed of the heat dissipation fan. The CPLD 520 is configured to take over to control the heat dissipation fan when determining the BMC 510 stops controlling the heat dissipation fan. The CPLD 520 is further configured to obtain the target rotational speed and the predetermined control curve according to the status of the BMC and/or the status of the server. The CPLD 520 is further configured to detect the environment temperature, obtain the target rotational speed according to the environment temperature and the predetermined control curve, and control the heat dissipation fan to work with the target rotational speed by the CPLD. The target rotational speed is less or equal to the predetermined rotational speed.

Detail descriptions for the modules can be referred to corresponding contents above, not repeated here.

A non-transitory computer-readable storage medium including program instructions for causing the computer apparatus (such as personal computer, device, or network device, etc.) or the processor to perform the method for controlling heat dissipation fan is also disclosed.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method of controlling a heat dissipation fan applied in a server comprising a module for controlling the heat dissipation fan, the module for controlling the heat dissipation fan comprising a baseboard management controller (BMC) and a complex programmable logic device (CPLD); the method comprising:

controlling the heat dissipation fan by the CPLD in response to the BMC stopped controlling the heat dissipation fan;

obtaining a predetermined rotational speed and a predetermined control curve by the CPLD according to a status of the BMC and/or a status of the server; and detecting a current environment temperature, obtaining a target rotational speed according to the current environment temperature and the predetermined control curve, and controlling the heat dissipation fan to work with the target rotational speed by the CPLD, wherein the target rotational speed is less than or equal to the predetermined rotational speed;

wherein the predetermined control curve is obtained by matching environment temperatures and rotational speeds, the target rotational speed is a rotational speed on the predetermined control curve corresponding to the current environment temperature.

2. The method of claim 1, wherein obtaining the predetermined rotational speed and the predetermined control curve by the CPLD according to the status of the BMC and/or the status of the server further comprises:

obtaining a first predetermined rotational speed and a first predetermined control curve by the CPLD in response to the BMC is determined abnormal, the abnormal of the BMC comprises hung up or upgrading.

3. The method of claim 2, wherein the first predetermined control curve is obtained by matching first environment temperature gradients and corresponding first rotational speed gradients, the corresponding first rotational speed gradients are obtained by operating pressure treatment to a target component in the first environment temperature gradient in a case that the server is working normally, wherein under the pressure treatment, the target component operates with a full load.

4. The method of claim 1, wherein obtaining the predetermined rotational speed and the predetermined control curve by the CPLD according to the status of the BMC and/or the status of the server further comprises:

obtaining a second predetermined rotational speed and a second predetermined control curve by the CPLD the BMC is determined been switched off and the server is in a status of an intelligent network card switched on.

5. The method of claim 4, wherein the second predetermined control curve is obtained by matching second environment temperature gradients and corresponding second rotational speed gradients, the corresponding second rotational speed gradients are obtained by operating pressure treatment to the intelligent network card in the second environment temperature gradient in the case that the server is working normally, wherein under the pressure treatment, the intelligent network card operates with a full load.

6. The method of claim 1, further comprising:

controlling the heat dissipation fan to work with the predetermined rotational speed by the CPLD in response to the CPLD not detecting the environment temperature.

7. The method of claim 1, further comprising:

returning the control of the heat dissipation fan to the BMC by the CPLD in response to the status of the BMC and/or the status of the server is a target status, wherein the target status is a normal working status of the BMC and a normal activating and working status of the server.

8. The method of claim 1, wherein the environment temperature comprises a temperature of the server or a temperature of a target component of the server.

9. A module configured for control a heat dissipation fan applied in a server, the module comprising:

a baseboard management controller (BMC) configured to control a rotational speed of the heat dissipation fan; and a complex programmable logic device (CPLD) configured to:

control the heat dissipation fan by the CPLD in response to the BMC stopped controlling the heat dissipation fan;

obtain a predetermined rotational speed and a predetermined control curve according to a status of the BMC and/or a status of the server; and detect a current environment temperature, obtain a target rotational speed according to the current environment temperature and the predetermined control curve, and control the heat dissipation fan to work with the target rotational speed, wherein the target rotational speed is less than or equal to the predetermined rotational speed; wherein the predetermined control curve is obtained by matching environment temperatures and rotational speeds, the target rotational speed is a rotational speed on the predetermined control curve corresponding to the current environment temperature.

10. The module of claim 9, wherein the CPLD configured to obtain a predetermined rotational speed and a predetermined control curve according to a status of the BMC and/or a status of the server further comprises:

obtain a first predetermined rotational speed and a first predetermined control curve in response to the BMC is determined abnormal, the abnormal of the BMC comprises hung up or upgrading.

11. The module of claim 10, wherein the first predetermined control curve is obtained by matching first environment temperature gradients and corresponding first rotational speed gradients, the corresponding first rotational speed gradients are obtained by operating pressure treatment to a target component in the first environment temperature gradient in the case that the server is working normally, wherein under the pressure treatment, the target component operates with a full load.

12. The module of claim 9, wherein the CPLD configured to obtain a predetermined rotational speed and a predetermined control curve according to a status of the BMC and/or a status of the server further comprises:

obtain a second predetermined rotational speed and a second predetermined control curve in response to the BMC is determined been switched off and the server is in a status of an intelligent network card switched on.

13. The module of claim 12, wherein the second predetermined control curve is obtained by matching second environment temperature gradients and corresponding second rotational speed gradients, the corresponding second rotational speed gradients are obtained by operating pressure treatment to the intelligent network card in the second environment temperature gradient in a case that the server is working normally, wherein under the pressure treatment, the intelligent network card operates with a full load.

14. The module of claim 9, wherein the CPLD is further configured to control the heat dissipation fan to work with the predetermined rotational speed in response to the CPLD not detecting the environment temperature.

15. The module of claim 9, wherein the CPLD is further configured to return the control of the heat dissipation fan to the BMC in response to the status of the BMC and/or the status of the server is a target status, the target status is a normal working status of the BMC and a normal activating and working status of the server.

16. The module of claim 9, wherein the environment temperature comprises a temperature of the server or a temperature of a target component of the server.

17. A non-transitory computer readable medium comprising program instructions for causing a server to execute at least following processes:

controlling a heat dissipation fan by a complex programmable logic device (CPLD) of the server in response to a baseboard management controller (BMC) of the server stopped controlling the heat dissipation fan;

obtaining a predetermined rotational speed and a predetermined control curve by the CPLD according to a status of the BMC and/or a status of the server; and detecting current environment temperature, obtaining a target rotational speed according to current environment temperature and the predetermined control curve, and controlling the heat dissipation fan to work with the target rotational speed by the CPLD, wherein the target rotational speed is less or equal to the predetermined rotational speed;

wherein the predetermined control curve is obtained by matching environment temperatures and rotational speeds, the target rotational speed is a rotational speed on the predetermined control curve corresponding to the current environment temperature.

18. The non-transitory computer readable medium of claim 17, wherein obtaining the predetermined rotational speed and the predetermined control curve by the CPLD according to the status of the BMC and/or the status of the server further comprises:

obtaining a first predetermined rotational speed and a first predetermined control curve by the CPLD in response to the BMC is determined abnormal, the abnormal of the BMC comprises hung up or upgrading.

19. The non-transitory computer readable medium of claim 17, wherein obtaining the predetermined rotational speed and the predetermined control curve by the CPLD according to the status of the BMC and/or the status of the server further comprises:

obtaining a second predetermined rotational speed and a second predetermined control curve by the CPLD in response to the BMC is determined been switched off and the server is in a status of an intelligent network card switched on.

20. The non-transitory computer readable medium of claim 17, causing the server to further execute:

controlling the heat dissipation fan to work with the predetermined rotational speed by the CPLD in response to the CPLD not detecting the environment temperature; and returning the control of the heat dissipation fan to the BMC by the CPLD in response to the status of the BMC and/or the status of the server is to a target status, wherein the target status is a normal working status of the BMC and a normal activating and working status of the server.

* * * * *